(12) United States Patent
Huang et al.

(10) Patent No.: US 8,420,544 B2
(45) Date of Patent: Apr. 16, 2013

(54) METHOD FOR FABRICATING INTERCONNECTION STRUCTURE WITH DRY-CLEANING PROCESS

(75) Inventors: Hsin-Fu Huang, Tainan (TW); Chi-Mao Hsu, Tainan (TW); Tsun-Min Cheng, Changhua (TW); Chin-Fu Lin, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 196 days.

(21) Appl. No.: 12/792,840

(22) Filed: Jun. 3, 2010

(65) Prior Publication Data

US 2011/0300706 A1 Dec. 8, 2011

(51) Int. Cl.
*H01L 21/461* (2006.01)

(52) U.S. Cl.
USPC ........... 438/706; 438/715; 438/623; 438/780; 257/E21.226

(58) Field of Classification Search .................. 438/706, 438/715, 623, 780; 257/E21.226
See application file for complete search history.

(56) References Cited

U.S. PATENT DOCUMENTS

| | | | |
|---|---|---|---|
| 6,107,192 A | 8/2000 | Subrahmanyan et al. | |
| 6,294,458 B1 | 9/2001 | Zhang et al. | |
| 6,458,691 B1 * | 10/2002 | Subramanian et al. | 438/638 |
| 7,273,808 B1 | 9/2007 | Lin | |
| 7,563,705 B2 | 7/2009 | Tonegawa et al. | |
| 2003/0100691 A1 * | 5/2003 | Lee et al. | 526/242 |
| 2005/0191850 A1 * | 9/2005 | Soda | 438/633 |
| 2007/0084827 A1 * | 4/2007 | Goela et al. | 216/88 |
| 2007/0117397 A1 | 5/2007 | Fu et al. | |

* cited by examiner

*Primary Examiner* — Thanh V Pham
(74) *Attorney, Agent, or Firm* — Ding Yu Tan

(57) ABSTRACT

A method for fabricating an interconnection structure includes the following steps. Firstly, a substrate having a first conductive layer thereon is provided. Next, an ultra low-k material layer is formed on the substrate. Next, a portion of the ultra low-k material layer is removed, so as to form an opening to expose the first conductive layer. Next, a dry-cleaning process is performed by using gas, so as to clean a surface of the first conductive layer exposed by the opening. The dry-cleaning process is performed at a temperature in a range from the room temperature to 100° C.

16 Claims, 5 Drawing Sheets

210

210

METHOD FOR FABRICATING INTERCONNECTION STRUCTURE WITH DRY-CLEANING PROCESS

BACKGROUND

1. Field of the Invention

The present invention relates to a semiconductor fabrication process, and more particularly to a method for fabricating an interconnection structure.

2. Description of the Related Art

Recently, copper dual damascene technique with ultra low-k material is the best solution of metal interconnection for fabricating logic integrated circuit chips with high integration and high speed or for semiconductor processes under 0.18 microns. The reason is that copper has a relatively low resistance value (30% less than aluminum) and a relatively good electro-migration resistance, and that the ultra low-k material can make for reducing RC delay between metal wires. Therefore, in the fabrication process of the integrated circuit, the copper dual damascene technique with ultra low-k material is becoming increasingly important.

There are many schemes to fabricate dual damascene structure and the most common integration approaches for the dual damascene architecture are via first, trench first and self-aligned. During the trench first process, a trench is formed in an ultra low k material layer firstly and then a via hole is formed by removing a portion of the ultra low k material layer. Consequently, some polymer produced by the process of forming the via tend to remain at a sidewall and a bottom (that is a surface of the copper metal) of the via hole. The remained polymer may cause some defects of enhancing the resistance value and having RC delay effect. Therefore, before the copper is filled into the via hole, a cleaning process for the trench and the via hole should be carried out firstly, so as to remove the remained polymer at the sidewalls and the bottoms of the trench and the via hole.

Generally, the cleaning process is a dry-cleaning process. That is the remained polymer in the trench and the via hole is removed by a plasma cleaning process. However, because the ultra low-k material layer may react with hydrogen ions and a dielectric coefficient of the ultra low-k material layer would be shifted and increased, a conventional reactive pre-clean (RPC) process is unsuitable for the dual damascene structure having the ultra low-k material layer. Therefore, a plasma cleaning process using argon gas appears. The plasma cleaning process using the argon gas may avoid deviation of the dielectric coefficient of the ultra low-k material layer in the fabrication process, but the fabricated dual damascene structure using the method has a problem of low reliability.

U.S. Pat. No. 6,713,402 disclosed a method for polymer removal following etch-stop layer etch. In the method, after the via hole is formed, the substrate is transferred to a plasma cleaning chamber of about 310° C., and then the hydrogen-containing plasma is introduced to remove the remained polymer. However, in the method of high temperature, some organic gas would be generated. The organic gas not only may affect bonding force between the adjacent layers, but also tends to react with the hydrogen ions to form byproducts. The porous property of the ultra low k material facilitates the byproducts adhering thereon and at the sidewall and the bottom of the via hole, so that a process yield of the dual damascene structure would be decreased.

What is needed, therefore, is a method for fabricating an interconnection structure that can overcome the above-mentioned shortcomings.

BRIEF SUMMARY

The present invention relates to a method for fabricating an interconnection structure, which can remove byproducts in a fabrication process without damaging the interconnection structure, so as to increase a process yield.

The present invention provides a method for fabricating an interconnection structure, which includes the following steps. Firstly, a substrate having a first conductive layer thereon is provided. Next, an ultra low-k material layer is formed on the substrate. Next, a portion of the ultra low-k material layer is removed, so as to form an opening to expose the first conductive layer. Next, a dry-cleaning process is performed by using gas, so as to clean a surface of the first conductive layer exposed by the opening. The dry-cleaning process is performed at a temperature in a range from the room temperature to 100° C.

In an embodiment of the present invention, the gas includes hydrogen gas.

In an embodiment of the present invention, the gas includes the hydrogen gas in an amount by weight of 20%.

In an embodiment of the present invention, the gas further includes inert gas. The inert gas can be helium gas.

In an embodiment of the present invention, a ratio of the hydrogen gas to the helium gas is 1:4.

In an embodiment of the present invention, in the gas, a flow rate of the hydrogen gas is 200 sccm, and a flow rate of the helium gas is 800 sccm.

In an embodiment of the present invention, the dry-cleaning process is performed at the temperature in the range from the room temperature to 60° C. For example, the dry-cleaning process is performed at 50° C.

In an embodiment of the present invention, a first barrier layer is further formed to cover the first conductive layer on the substrate before forming the ultra low k material layer, and after removing the portion of the ultra low-k material layer, a portion of the barrier layer is further removed, so as to form the opening to expose the portion of the first conductive layer.

In an embodiment of the present invention, before removing the portion of the ultra low k material layer, a hard mask is formed on the ultra low-k material layer, and a portion of the hard mask is removed, so as to expose the portion of the ultra low-k material layer for forming the opening.

In an embodiment of the present invention, a method of forming the opening may include the steps of removing a first portion of the ultra low-k material layer to form the trench and removing a second portion of the ultra low-k material layer located in the trench to form a via hole. The opening is composed of the trench and the via hole.

In an embodiment of the present invention, a second conductive layer is filled in the opening, so as to make the second conductive layer electrically connect to the first conductive layer.

In an embodiment of the present invention, before filling the second conductive layer in the trench and the opening, a second barrier layer is formed to cover sidewalls of the opening.

In an embodiment of the present invention, a dielectric coefficient of the ultra low-k material layer is in a range from 1.9 to 2.5. For example, the dielectric coefficient of the ultra low-k material layer is 2.0.

In the method for fabricating the interconnection structure of the present invention, after the opening is formed in the ultra low-k material layer, the dry-cleaning process is performed at the temperature in the range from the room temperature to 100° C. The outgassing gas that is outgassed by the gas used in the dry-cleaning process reacting with the byproducts remained in the opening can be reduced. Therefore, the outgassed gas can be exhausted completely. And thus, the outgassing gas would not affect the electric property of the interconnection structure.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
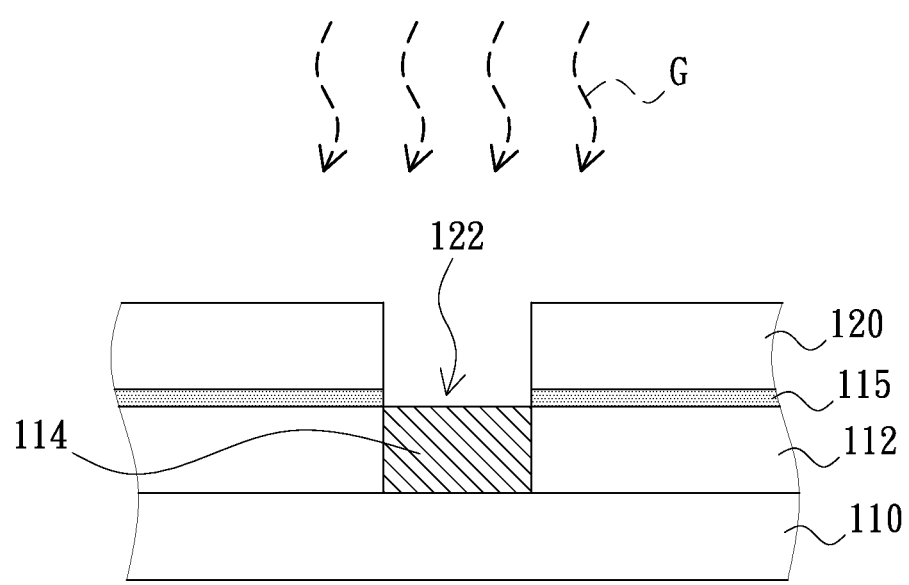
FIG. 1 is a cross-sectional, schematic view of an interconnection structure at a stage in a fabrication process according to an embodiment of the present invention.
Figure 2A:
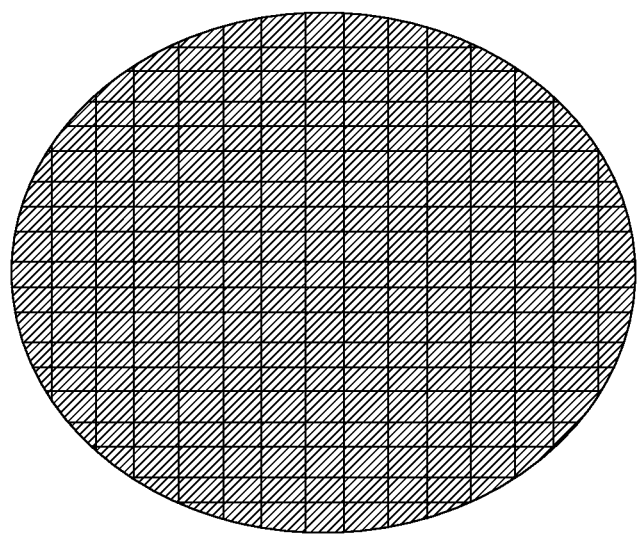
FIGS. 2A to 2D are diagrams illustrate dense via chain in WAT of different wafers having an interconnection structure cleaned with different temperature.
Figure 2B:
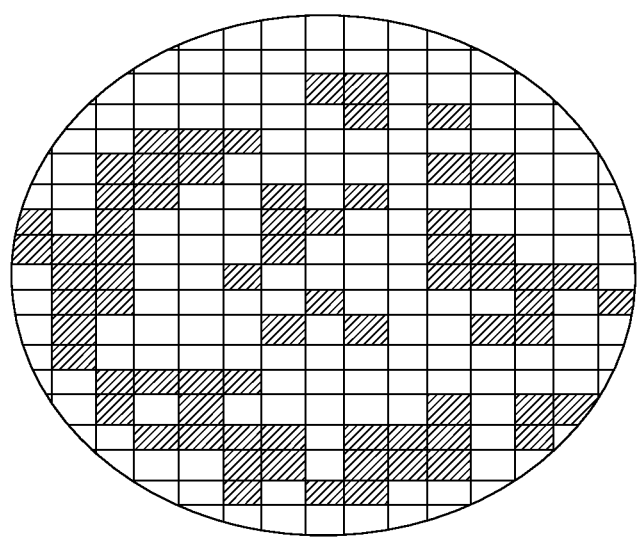
Figure 2C:
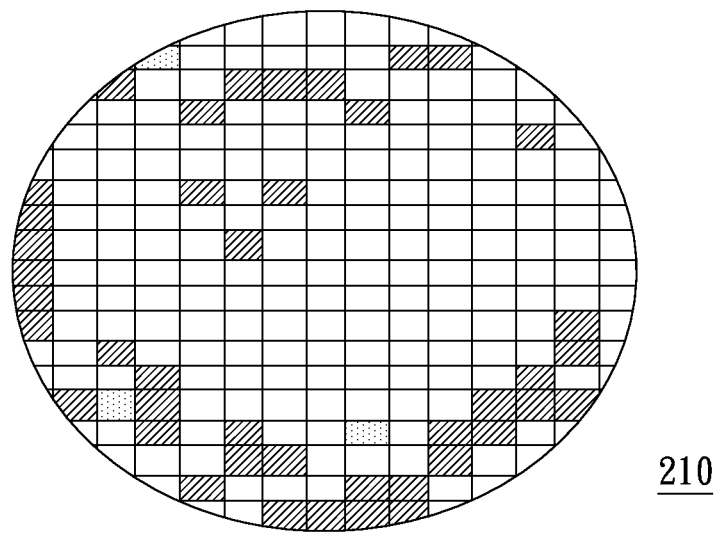
Figure 2D:
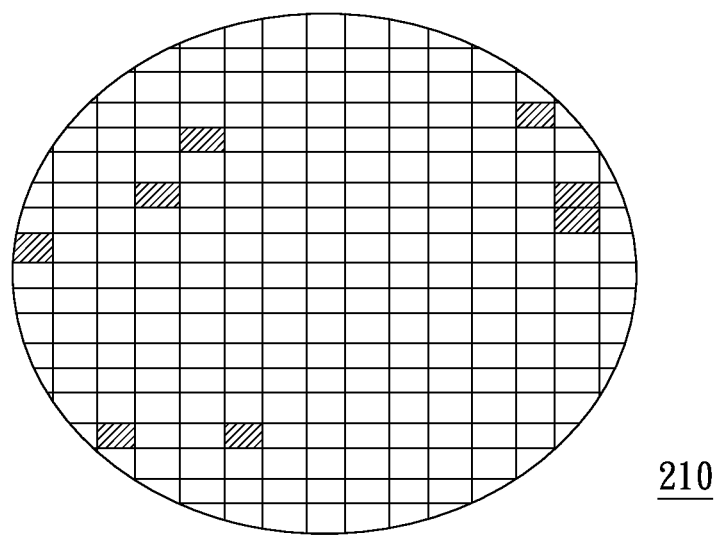

FIG. 1 is cross-sectional, schematic view of an interconnection structure at a stage in a fabrication process according to an embodiment of the present invention. Referring to FIG. 1, first, a substrate 110 is provided. The substrate 110 has a dielectric layer 112 and a first conductive layer 114. The first conductive layer 114 can be embedded in the dielectric layer 112. In the embodiment, material of the first conductive layer 114 is, for example, copper. Next, a first ultra low-k material layer 120 is formed on the substrate 110, so as to cover the first conductive layer 114. In the embodiment, material of the ultra low k material layer 120 is, for example, BlackDiamond II produced by AMAT, and a dielectric coefficient of the first ultra low-k material layer 120 is in a range from 1.9 to 2.5, and is preferably 2.0.

In addition, in the embodiment, before forming the first ultra low-k material layer 120, a barrier layer 115 is formed on the substrate 110 firstly. Material of the barrier layer 115 can be silicon nitride. The barrier layer 115 can prevent metal atoms of the first conductive layer 114 from diffusing into the first ultra low-k material layer 120.

A portion of the first ultra low-k material layer 120 and a portion of the barrier layer 115 correspondingly are removed, so that an opening 122 is formed to expose the first conductive layer 114. In details, the opening 122 is formed by using a patterned photoresist layer 130 as a etch mask for etching the portion of the first ultra low-k material layer 120 and the portion of the barrier layer 115.

Moreover, after removing the patterned photoresist layer 130, a dry-cleaning process is performed to prevent the byproducts generated in the etching process from remaining in the opening 122, which may affect a process yield of a following fabrication process. In the embodiment, the byproducts remained in the opening 122 are removed by a plasma cleaning process. Furthermore, since Aktiv pre-clean process (abbreviated to APC) has high dean efficiency and the interconnection structure cleaned thereby may has improved eletro-migration reliability, the opening 122 is cleaned by APC in this embodiment. In details, the plasma cleaning process is performed by introducing gas G. The gas G can include hydrogen gas. Hydrogen radicals generated by the hydrogen gas can react with the byproducts remained in the opening 122 to form gas, and the reactant of the gas can be exhausted while a degassing process is carried out with the dry-cleaning process.

It should be noted, the hydrogen radicals may react with the residual including silicon to outgas gas at a high temperature (such as over 150° C.). If the outgassed gas is not exhausted completely before filling conductive metal in the opening 122, electrical property of the first conductive layer 114 would be adversely affect while a subsequent thermal process is carried out. Therefore, in this embodiment, the dry-cleaning process should be performed at a temperature in a range from the room temperature to 100° C., preferably in the range from the room temperature to 60° C., and more preferably at 50° C. to reduce the outgassed gas generated by the reaction between the hydrogen radicals and the residual including silicon. Herein, the room temperature is not a temperature under the circumstance of cooling and heating, and generally, the room temperature is 25° C., and the present invention is not limited herein.

FIGS. 2A to 2D are diagrams illustrate dense via chain in WAT of different wafers having an interconnection structure cleaned with different temperature. The regions filled of oblique lines represent via open region of the wafer. Referring to FIG. 2A to 2D, the density of the via open region of the wafers 210 having the interconnection structure cleaned by APC process at 310° C.-200° C. and 150° C. are higher than the density of the via open region of the wafers 210 having the interconnection structure cleaned by APC process at 50° C. That is, the process yield of the interconnection structure may be improved by controlling the temperature under 100° C. during the process of cleaning the opening 122 shown in FIG. 1.

Referring to FIG. 1 again, to avoid a excessive access of the hydrogen gas, which may result in that excessive outgassed gas are outgassed by the byproducts remained in the opening 122 and can not be exhausted completely, a usage amount of the gas G can be reduced. The gas G can include hydrogen gas and inert gas. The inert gas can be helium gas. The gas can include the hydrogen gas in an amount by weight of 20%. For example, in the gas G, a ratio of the hydrogen gas to the helium gas is 1:4, and a flow rate of the hydrogen gas is 200 sccm, and a flow rate of the helium gas is 800 sccm.

The fabrication process of the above embodiment can be used in any suitable interconnection structures having the ultra low-k material layer. To better understand the present invention, the following will take a fabrication process of the damascene structure with drawings as an example to explain the present invention, and the present invention is not limited herein.

Figure 3A:
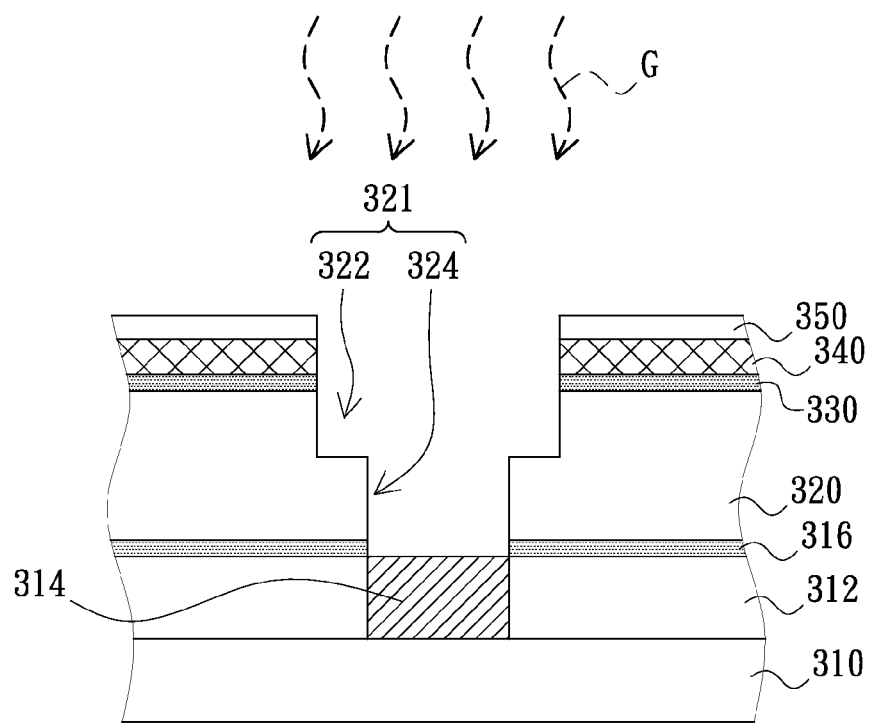
FIGS. 3A and 3B are cross-sectional, schematic views of a dual damascene structure at stages in a fabrication process according to an embodiment of the present invention, where a trench is formed firstly.
Figure 3B:
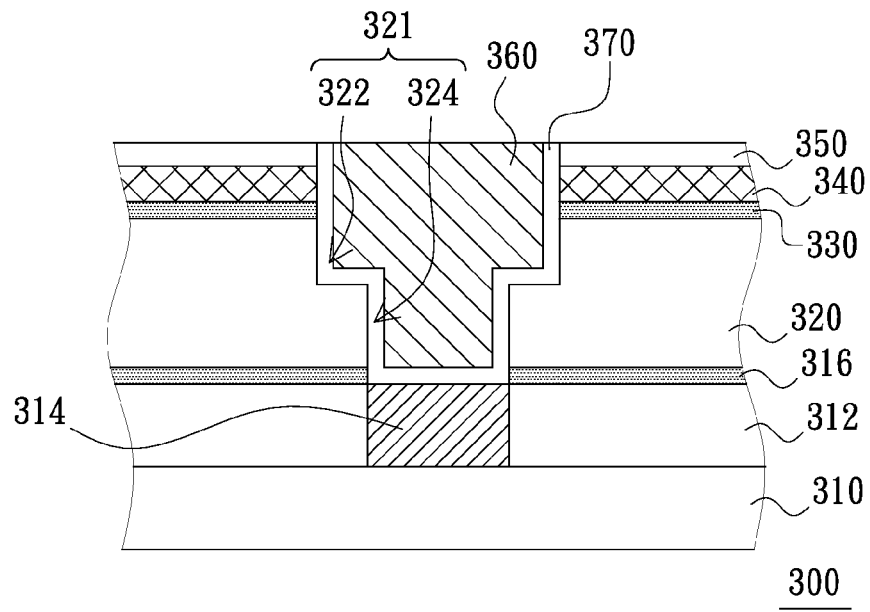

FIGS. 3A to 3B are cross-sectional, schematic views of a dual damascene structure at stages in a fabrication process according to an embodiment of the present invention, where a trench is formed firstly. Referring to FIG. 3A, first, a substrate 310 is provided. The substrate 310 has a dielectric layer 312 and a first conductive layer 314. The first conductive layer 314 can be embedded in the dielectric layer 312. The first conductive layer 314 has a barrier layer 316 formed thereon. Material of the barrier layer 316 can be silicon nitride. Next, an ultra low-k material layer 320, an etching stop layer 330, a hard mask (HM) 340 and a cap layer 350 are formed on the barrier layer 316 in above mentioned order. Material of the ultra low-k material layer 320 can be BlackDiamond II produced by AMAT and a dielectric coefficient of the ultra low-k material layer 320 is, for example, in a range from about 1.9 to about 2.5, and is preferably 2.0. Material of the etching stop layer 330 can be silicon nitride (SiN). Material of the hard mask 340 can be titanic nitride (TiN). The cap layer 350 can be a single-layer structure or a multi-layer structure, such as SiON/SiO. Next, a portion of cap layer 350, a portion of the hard mask 340, a portion of the etching stop layer 330 and a portion of the ultra low k material layer 320 are removed to form a trench 322 in the ultra low k material layer 320. In this embodiment, the portions of the layers are moved by lithography and etching process. Moreover, the etching process is stopped at a depth of the ultra low k material layer 320 determined by controlling the parameters of etching process, therefore the trench 322 is formed.

After forming the trench 322, a portion of the ultra low-k material layer 320 located in the trench 322 and the corresponded portion of the first barrier layer 316 are removed to form a via hole 324. The trench 322 and the via hole 324 construct an opening 321 exposing the first conductive layer 314.

Specifically, during the process of forming the via hole 324, a patterned photoresist layer (not shown in FIG. 3A) exposing the portion of the ultra low k material layer 320 located in the trench 322 is formed firstly. Second, the portion of the ultra low-k material layer 320 located in the trench 322 and the corresponded portion of the first barrier layer 316 are removed by using the patterned photoresist layer as an etching mask to form the via hole 324. Then, the patterned photoresist layer is removed.

As the aforementioned, since byproducts generated by the process of removing the photoresist layer are remained in the opening 321, a dry-cleaning process is carried out to remove byproducts remained in the trench 322 and the via hole 324.

In the embodiment, the dry-cleaning process is performed by a plasma cleaning process using gas G. The dry-cleaning process is performed at a temperature in a range from the room temperature to 100° C., preferably in the range from the room temperature to 60° C., and more preferably at 50° C. The gas G can include hydrogen gas. Since the outgassed gas generated by the reaction between the hydrogen radicals and the residual including silicon can be reduced by performing plasma cleaning process at temperature under 100° C., the process of this embodiment not only can eliminate the byproducts remaining in the trench 322 and via hole 324, also facilitate the process of completely pumping the outgassed gas out from the trench 322 and via hole 324.

In this embodiment, the gas G includes the hydrogen gas in an amount by weight of 20% to 50%, and the rest of the gas G is inert gas, such as helium gas. In details, in the gas G, a ratio of the hydrogen gas to the helium gas can be 1:2 or 1:4. If the ratio of the hydrogen gas to the helium gas is 1:4, a flow rate of the hydrogen gas can be 200 sccm, and a flow rate of the helium gas can be 800 sccm.

As mentioned above, in the embodiment, the amount of the outgassed gas that is outgassed by the hydrogen gas reacting with the byproducts remained in the opening can be reduced by controlling the temperature of the dry-cleaning process. Furthermore, the amount of the outgassed gas can be further reduced by decreasing the amount of the hydrogen gas. Therefore, the outgassed gas can be exhausted completely, and would not affect the electric property of the dual damascene structure in following fabrication process.

Figure 4:
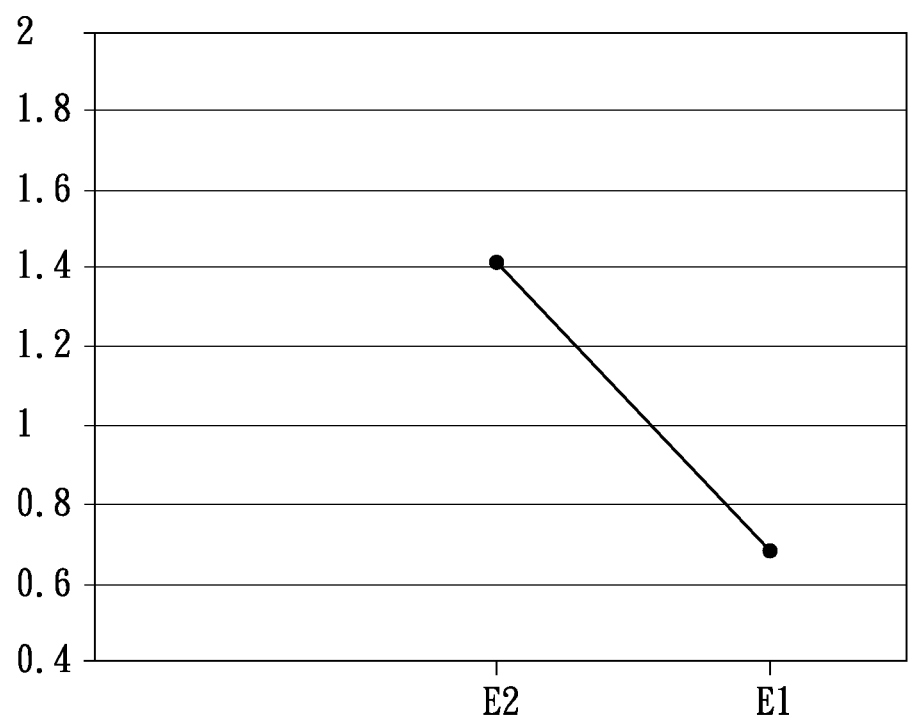
FIG. 4 is a comparative graph of measured copper signal in openings, after which are formed in the above process and in which residues are removed using different dry-cleaning processes.

FIG. 4 is a comparative graph of measured copper signal in openings by Auger electron spectroscopy (AES), after which are formed in the above process and in which residues are removed using different dry-cleaning processes. Referring FIGS. 3A and 4, two points of E1 and E2 on the horizontal coordinate represent two interconnection structures using dry-cleaning processes with different temperature correspondingly, and vertical axis coordinate value represents measured copper signal in openings. E1 represents that the interconnection structure using APC process is performed at 310° C., and E2 represents that the interconnection structure using APC process is performed at 50° C. . The measured copper signal corresponding to E2 is greater than that corresponding to E1. Therefore, in comparison to performing the APC at 310° C., performing the APC process at 50° C. would make the byproducts remained the opening be removed more effectively.

Referring to FIG. 3B, a second conductive layer 360 is filled in the trench 322 and the via hole 324, so as to form the dual damascene structure 300. Material of second conductive layer 360 can be copper.

In addition, in the embodiment, before filling the second conductive layer 360 in the trench 322 and the via hole 324, a second barrier layer 370 is formed to cover the sidewalls of the trench 322 and the via hole 324, so that metal atoms of the second conductive layer 370 that is formed subsequently can be prevented from diffusing into the first ultra low-k material layer 320 through the sidewalls of the trench 322 and the via hole 324. In the period of forming the second barrier layer 470, a thickness of the second barrier layer 470 on a bottom of the via hole 324 can be controlled by adjusting process parameters, so that the resistance between the first conductive layer 314 and the second conductive layer 370 that is formed subsequently can be reduced.

In the above embodiments of the present invention, after the opening is formed in the ultra low-k material layer, the dry-cleaning process is performed at the temperature in the range from the room temperature to 100° C. The outgassed gas that is formed by the gas used in the dry-cleaning process reacting with the byproducts remained in the opening can be reduced. Therefore, the outgassed gas can be exhausted completely. Furthermore, in the above embodiments of the present invention, the amount of the outgassed gas can also be reduced by decreasing the amount of the hydrogen gas used in the dry-cleaning process, so that the outgassed gas can be exhausted completely.

In summary, the method of the present invention, not only the byproducts remained in the opening can be removed effectively, but also the outgassed gas generated in the dry-cleaning process can be exhausted. Therefore, the outgassed gas would not affect the electric property of the interconnection structure. Consequently, the reliability and the process yield of the interconnection structure can be improved simultaneously.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:
1. A method for fabricating an interconnection structure, comprising:
    providing a substrate having a first conductive layer thereon;
    forming an ultra low-k material layer on the substrate;

removing a portion of the ultra low-k material layer, so as to form an opening to expose the first conductive layer; and performing a dry-cleaning process by using a gas, so as to clean a surface of the first conductive layer exposed by the opening, the dry-cleaning process being performed at a temperature in a range from the room temperature to 100° C.

2. The method for fabricating an interconnection structure as claimed in claim 1, wherein the gas comprises hydrogen gas.

3. The method for fabricating an interconnection structure as claimed in claim 2, wherein the gas comprises the hydrogen gas in an amount by weight of 20% to 50%.

4. The method for fabricating an interconnection structure as claimed in claim 2, wherein the gas further comprises inert gas.

5. The method for fabricating an interconnection structure as claimed in claim 4, wherein the inert gas comprises helium gas.

6. The method for fabricating an interconnection structure as claimed in claim 5, wherein a ratio of the hydrogen gas to the helium gas is from 1:2 to 1:4.

7. The method for fabricating an interconnection structure as claimed in claim 6, wherein in the gas, a flow rate of the hydrogen gas is 200 sccm, and a flow rate of the helium gas is 800 sccm.

8. The method for fabricating an interconnection structure as claimed in claim 1, wherein the dry-cleaning process is performed at the temperature in the range from the room temperature to 60° C.

9. The method for fabricating an interconnection structure as claimed in claim 8, wherein the dry-cleaning process is performed at 50° C.

10. The method for fabricating an interconnection structure as claimed in claim 1, further comprising forming a barrier layer to cover the first conductive layer on the substrate before forming the ultra low k material layer, and after removing the portion of the ultra low-k material layer, a portion of the barrier layer being further removed, so as to form the opening to expose the portion of the first conductive layer.

11. The method for fabricating an interconnection structure as claimed in claim 1, before removing the portion of the ultra low k material layer, further comprising:

forming a hard mask on the ultra low-k material layer; and removing a portion of the hard mask, so as to expose the portion of the ultra low-k material layer for forming the opening.

12. The method for fabricating an interconnection structure as claimed in claim 11, wherein the method of forming the opening comprise:

removing a first portion of the ultra low-k material layer to form a trench; and removing a second portion of the ultra low-k material layer located within the trench to form a via hole construct the opening with the trench.

13. The method for fabricating an interconnection structure as claimed in claim 12, further comprising filling a second conductive layer in the opening, so as to make the second conductive layer electrically connect to the first conductive layer.

14. The method for fabricating an interconnection structure as claimed in claim 13, before filling the second conductive layer in the trench and the opening, further comprising forming a second barrier layer to cover sidewalls of the opening.

15. The method for fabricating an interconnection structure as claimed in claim 1, wherein a dielectric coefficient of the ultra low-k material layer is in a range from 1.9 to 2.5.

16. The method for fabricating an interconnection structure as claimed in claim 15, wherein the dielectric coefficient of the ultra low-k material layer is 2.0.

* * * * *